(12) United States Patent
Riaziat

(10) Patent No.: US 9,558,932 B2
(45) Date of Patent: Jan. 31, 2017

(54) LATERAL WAFER OXIDATION SYSTEM WITH IN-SITU VISUAL MONITORING AND METHOD THEREFOR

(71) Applicant: Majid Riaziat, San Jose, CA (US)

(72) Inventor: Majid Riaziat, San Jose, CA (US)

(73) Assignee: CALIFORNIA SCIENTIFIC, INC., Sunnyvale, CA (US)

( * ) Notice: Subject to any disclaimer, the term of this patent is extended or adjusted under 35 U.S.C. 154(b) by 0 days.

(21) Appl. No.: 14/686,488

(22) Filed: Apr. 14, 2015

(65) Prior Publication Data

US 2015/0364320 A1 Dec. 17, 2015

Related U.S. Application Data

(60) Provisional application No. 61/998,050, filed on Jun. 17, 2014.

(51) Int. Cl.
*H01L 21/02* (2006.01)
*H01L 21/67* (2006.01)
*H01S 5/183* (2006.01)

(52) U.S. Cl.
CPC ......... *H01L 21/02241* (2013.01); *H01L 21/67* (2013.01); *H01L 21/67017* (2013.01); *H01S 5/18311* (2013.01)

(58) Field of Classification Search
CPC .................... H01L 21/31662; H01L 21/67115; H01L 21/31612; H01L 21/28194; H01L 21/28211; H01L 21/02271; H01L 21/0228; H01L 21/02307; H01L 21/02337; H01L 21/67; H01L 21/02241; H01L 21/02247; H01L 21/02249; C23C 16/481; C23C 16/483; C30B 25/02; C30B 25/12
USPC ........................................ 438/216, 787, 773
See application file for complete search history.

(56) References Cited

U.S. PATENT DOCUMENTS 6,090,212 A * 7/2000 Mahawili ............ C23C 16/4584
 118/500
6,297,172 B1 * 10/2001 Kashiwagi ........ H01L 21/02238
 257/E21.285
2002/0090776 A1 * 7/2002 Nakata .............. H01L 21/28185
 438/216

* cited by examiner

*Primary Examiner* — Caleen Sullivan
(74) *Attorney, Agent, or Firm* — Weiss & Moy, P.C.; Jeffrey D. Moy

(57) ABSTRACT

Wafer oxidation apparatus for selective oxidation of a semiconductor workpiece has an oxidation chamber. The oxidation chamber is heated by external infrared heating lamps. A chuck assembly is disposed within the oxidation chamber and configured to be approximately thermally isolated from the oxidation chamber. Carrier gas pathways deliver heated carrier gasses to the oxidation chamber at variable rates for oxidation uniformity.

17 Claims, 6 Drawing Sheets

FIG. 4A          FIG. 4B

LATERAL WAFER OXIDATION SYSTEM WITH IN-SITU VISUAL MONITORING AND METHOD THEREFOR

RELATED APPLICATIONS

The present patent application claims the benefit of U.S. Provisional Application No. 61/998,050, filed Jun. 17, 2014, entitled "A Lateral Wafer Oxidation System with In-Situ Visual Monitoring" in the name of the same inventors, and which is incorporated herein by reference in its entirety.

TECHNICAL FIELD

The present application in general relates to the field of wafer processing, and more specifically, to a system and method for the fabrication of oxide apertures on semiconductor wafers with application to fabrication of VCSEL devices.

BACKGROUND

Precision features may be fabricated on semiconductor wafers such as GaAs, InP, and the like through formation of oxide layers. Of particular interest are such applications for manufacture of vertical cavity surface emitting lasers (VCSELs). The prior art has employed wet oxidation in conjunction with calibrated oxidation rates and directly observed optical monitoring of the wafer within an oxidation furnace where temperature and humidity are controlled. One typical example of prior art is described by Feld, et al, IEEE Photonics Technology Letters, vol. 10, no. 2, February 1998 wherein the oxidation furnace includes a chamber featuring an internally disposed heat source in proximity to a chuck supporting the wafer. A mass flow controlled vapor source is arranged to introduce the vapor into the chamber, at approximately atmospheric pressure. A microscope views the oxidation site of the wafer. Oxidation rates of the order $\mu m/min$ are realized and the process is terminated under manual control of the vapor source.

Controlling the final aperture size may be achieved, if so desired, by direct control of oxidation time, based on prior calibration. Because of wafer to wafer variations, manufacturers presently prefer to view the formation of the aperture in-situ during oxidation and to stop the process once it has been determined that the desired aperture size has been reached.

It would thus be desirable to provide a system and method that tries to optimizes the oxidation process while maintaining in-situ monitoring capability.

SUMMARY

In accordance with one embodiment, a wafer oxidation apparatus for selective oxidation of a semiconductor workpiece is disclosed. The wafer oxidation apparatus has an oxidation chamber. The oxidation chamber has an inlet port and an outlet port. At least one window is formed in the oxidation chamber. A chuck assembly is disposed within the oxidation chamber and configured to be approximately thermally isolated from the oxidation chamber. Carrier gas pathways deliver carrier gasses to the oxidation chamber.

In accordance with one embodiment, a method of lateral oxidation of laterally defined features on a semiconductor wafer is disclosed. The method comprising: preparing desired features on the wafer; placing the prepared wafer inside a chamber; directing a non-oxidizing gas flow at a desired gas temperature through the chamber; causing temperature of the prepared wafer to rise to a desired value; terminating flow of the non-oxidizing gas and then initiating flow of oxidizing gas at a desired gas temperature through the chamber; continuing the flow of oxidizing gas until a termination point is reached; terminating flow of the oxidizing gas and then resuming flow of the non-oxidizing gas through the chamber; reducing temperature of the prepared wafer to ambient conditions; and terminating gas flow.

In accordance with one embodiment, a wafer oxidation apparatus for selective oxidation of a semiconductor workpiece is disclosed. The wafer oxidation apparatus has an oxidation chamber having an inlet port and an outlet port. A first window is formed on a top surface of the oxidation chamber. A second window is formed on a bottom surface of the oxidation chamber. A heat source is disposed externally to the oxidation chamber and arranged to direct a radiation flux through the second window. A chuck assembly is disposed within the oxidation chamber and configured to be approximately thermally isolated from the oxidation chamber. Carrier gas pathways deliver carrier gasses to the oxidation chamber.

BRIEF DESCRIPTION OF THE DRAWINGS

The present application is further detailed with respect to the following drawings. These figures are not intended to limit the scope of the present application but rather illustrate certain attributes thereof.

DESCRIPTION OF THE APPLICATION

The description set forth below in connection with the appended drawings is intended as a description of presently preferred embodiments of the disclosure and is not intended to represent the only forms in which the present disclosure may be constructed and/or utilized. The description sets forth the functions and the sequence of steps for constructing and operating the disclosure in connection with the illustrated embodiments. It is to be understood, however, that the same or equivalent functions and sequences may be accomplished by different embodiments that are also intended to be encompassed within the spirit and scope of this disclosure.

Lateral wet oxidation of aluminum-rich compound semiconductors and its application to device fabrication were discovered and reported in 1990 by Dallesasse, et al. Appl. Phys. Lett. 57, 2844 (1990).

Figure 1:
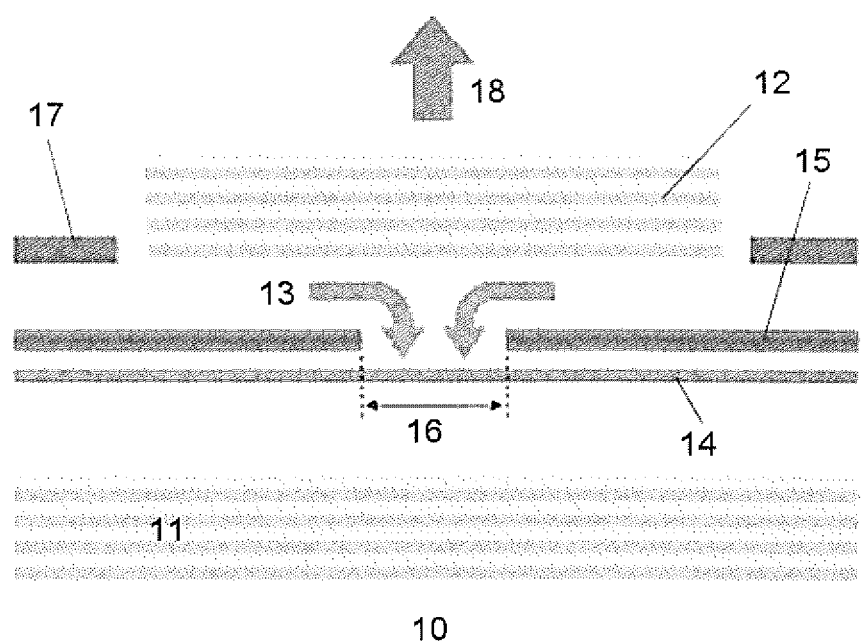
FIG. 1 is a schematic diagram of a typical VCSEL and the role of the oxide aperture FIG. 2 describes the VCSEL processing prior to the oxide formation step.

One specific intended application of this work is fabrication of Vertical Cavity Surface Emitting Lasers (VCSELs) as shown in FIG. 1. Lateral wet oxidation may be used to form an aperture 16 for the confinement of electrical current. The oxide aperture 16 also affects the optical modes and the shape of the output beam 18. In VCSELs, the diameter of the oxide aperture 16 typically ranges from 4 to 10 microns depending on the design. The diameter of the aperture 16 needs to be precisely controlled.

Figure 2:
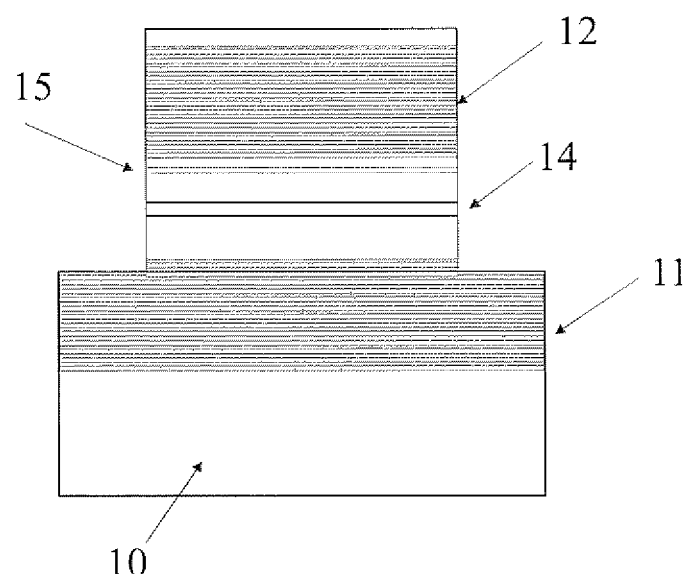

As practiced in prior art, the fabrication of the VCSEL starts with growth of the needed semiconductor material layer by layer (epitaxial structure) over a semiconductor substrate 10. The grown structure includes two stacks of layered mirrors known as Distributed Bragg Reflectors (DBRs) 11 and 12. The active layers 14 that provide optical gain are grown between the two mirrors known as Distributed Bragg Reflectors (DBRs) 11 and 12. The epitaxial structure of the VCSEL contains one or more layers 15 of high aluminum content alloys such as $Al_{0.97}Ga_{0.03}As$ or AlAs suitable for wet oxidation. In the fabrication process, the wafer with the epitaxial layers on top gets patterned by optical lithography whereby the individual VCSELs are defined by etching away the material around them, and leaving an array of pedestals known as the VCSEL mesas. The cross section of one such mesa is shown in FIG. 2. With mesa foliation, the edges of high aluminum content layer(s) 15 are exposed and the wafer is deemed "prepared" for the lateral oxidation processing here described. The wafer is then placed in an oxidation chamber that raises and maintains its temperature to the vicinity of 400° C. in an environment of inert gas (e.g. $N_2$) to begin with, and switching to an oxidizing agent (e.g. water vapor) subsequently. The aluminum content of the oxidation layer(s) starts to oxidize from the outer edge of the VCSEL mesa and closes in toward the center. The oxidation process needs to stop once the desired aperture size is reached. This is done by switching the gas that flows through the chamber from oxidizing (wet) to non-oxidizing (dry) and reducing the temperature in the chamber. The entire process is carried out in the absence of any ambient oxygen in the chamber. It is thought that the presence of ambient oxygen causes the formation of impermeable oxide and stops the growth of lateral oxidation.

Controlling the final aperture size may be achieved, if so desired, by direct control of oxidation time, based on prior calibration. Because of wafer to wafer variations, manufacturers presently prefer to view the formation of the aperture 16 in-situ during oxidation and to stop the process once it has been determined that the desired aperture size has been reached.

It should be apparent that temperature uniformity over the workpiece is essential and that practical improvement in instrumentation and method will enable efficiencies to be realized in the discussed operations for lateral oxidation.

Figure 3:
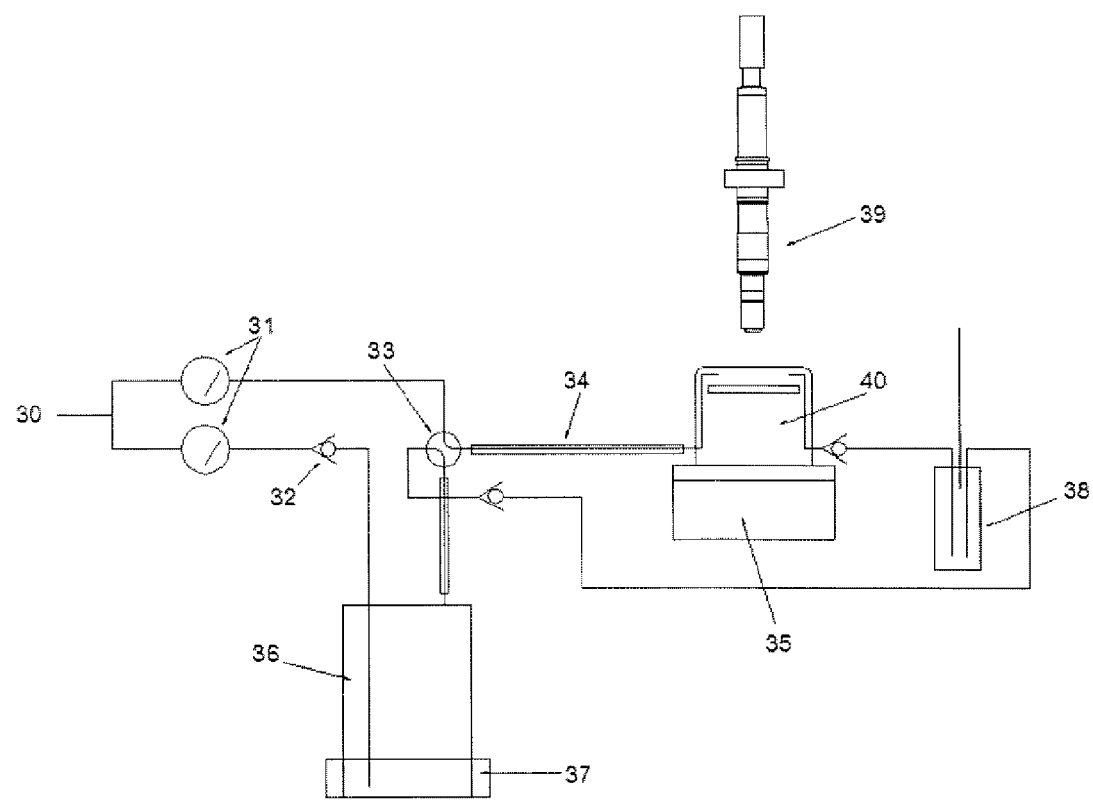
FIG. 3 shows the major parts of the overall wafer oxidation system of the present invention.
Figure 4:
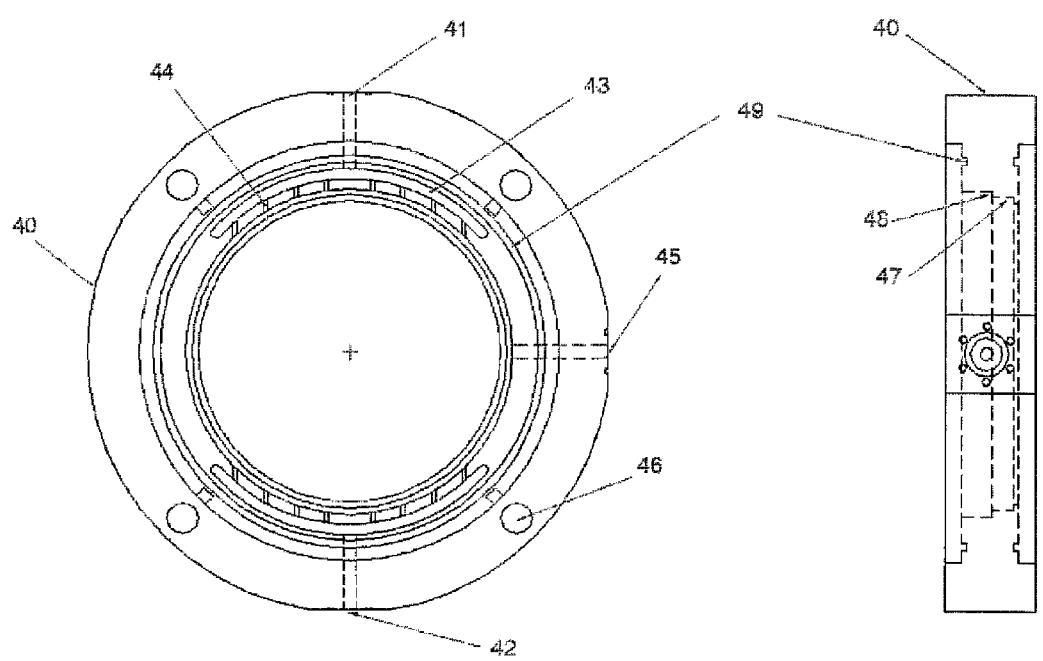
FIG. 4A is the top view of the metallic portion of the oxidation chamber of FIG. 3.
FIG. 4B is a radial cross section of the metallic portion of the oxidation chamber of FIG. 3.
Figure 5:
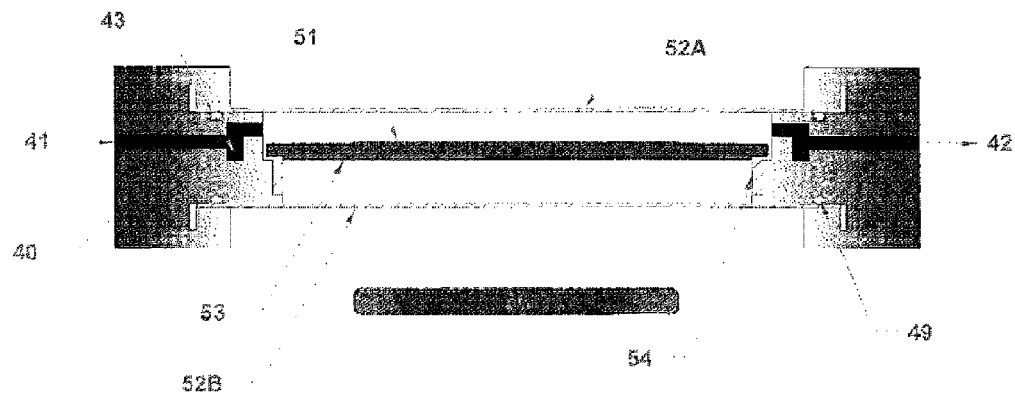
FIG. 5 is a cross-section of the oxidation chamber of FIG. 3 with the constituent components and the external heating element.

Turning now to FIG. 3, a block diagram of the disclosed oxidation system in accordance with one exemplary embodiment is shown with elaboration of the oxidation chamber 40 shown in FIGS. 4A, 4B and 5. Incoming nitrogen (or other non-oxidizing or inert) carrier gas 30 can be split into a "dry gas" path and a "wet gas" path, each can be controlled by a valve or a mass flow controller 31. The gas designated as wet, can go through a hot water bubbler 36 and can become saturated with water vapor. Alternatively, water vapor from a vapor generator may be added to the carrier gas.

Figure 6A:
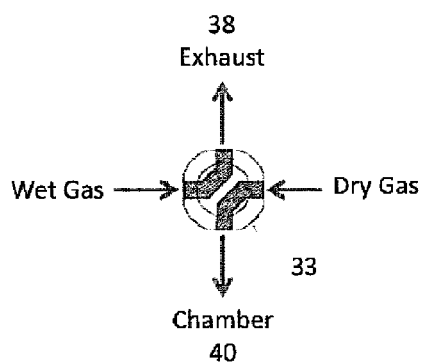
FIG. 6A describes the selectable path multiport valve wherein the dry gas path is directed to the chamber.
Figure 6B:
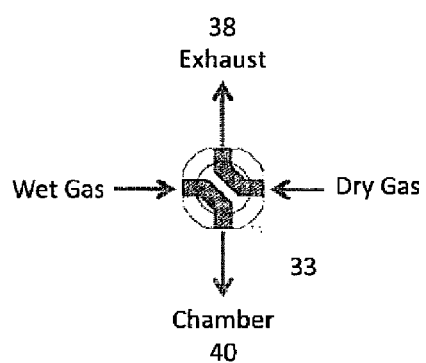
FIG. 6B describes the selectable path multiport valve wherein the oxidizing gas path is directed to the chamber.

A selectable path, four port valve 33 can be operable to select either dry or wet carrier gas to enter the oxidation chamber 40 on a path through heating tube 34. Such a valve 33 can be described as shown in FIGS. 6A and 6B. The wafer chuck 53 in the center part of the oxidation chamber 40 can be heated by an external heater 35 that employs an infrared heating lamp 56 to raise and maintain the wafer chuck 53 to the desired process temperature. The dry or wet carrier gas can pass through a "superheater" or heated tube 34 to bring the gas flow to the desired process temperature and enter the oxidation chamber 40 on one side and exits on the opposite side to the exhaust bubbler 38. The exhaust bubbler 38 can keep ambient air from entering the oxidation chamber 40 and traps the byproducts of the oxidation reaction. The portion of the carrier gas that does not enter the oxidation chamber 40 can exit the system through the same exhaust bubbler 38. An alternative to using a heated tube 34 can be to use a gas heater to create superheated steam and gas to be injected into the oxidation chamber 40 at a temperature closer to the oxidation temperature. This can minimize the non-uniform cooling effect that the injected gas may have in the oxidation chamber 40.

FIGS. 4A and 4B shows the metallic portion of the oxidation chamber 40 in more detail. Gas can flow into the oxidation chamber 40 through the port 41 and a condensation barrier trough 43, and grooves 44 in the interior wall of the oxidation chamber 40 that form the "showerhead" for even distribution of the gas flow. A temperature sensor is inserted through the hole 45 shown on the right hand side of the oxidation chamber 40. The temperature sensor is inserted inside the graphite chuck 53 that supports the wafer 51.

The cross section of the oxidation chamber 40 is shown in FIG. 5. The top and bottom of the oxidation chamber 40 are closed by quartz windows 52A and 52B pressed against the O-rings (not shown) to form a gas tight seal. The O-rings are held in place by O-ring grooves 49 in the oxidation chamber 40.

The graphite chuck 53 that supports the wafer has no contact with the metallic body of the oxidation chamber 40. The chuck 53 is supported on a quartz insulator ring 54. This maintains the graphite in thermal isolation from the oxidation chamber 40 and improves temperature uniformity over the wafer 51. In another embodiment, a high thermal conductivity material such as pyrolytic graphite or silicon carbide may be deposited on the wafer chuck for additional thermal leveling. An infrared heating lamp 56 placed outside the oxidation chamber 40 is used to raise the temperature of the graphite chuck 53 by transmission through quartz window 52B. The heating lamp 56 is a "short wave" infrared lamp. Quartz is transparent to short wave infrared and allows radiation to be transmitted for absorbance by the graphite to uniformly heat the wafer 51.

The top quartz window 52A of the oxidation chamber 40 allows the wafer 51 to be viewed by an infrared microscope and camera assembly 39 that display the oxide aperture as it forms during oxidation. Infrared light used for this purpose (separate from the heating radiation) typically ranges from 800 nm to 1000 nm. A tunable or switchable light source through a coaxial microscope illuminator is preferred for this purpose. An alternative embodiment employs filtered white light for observational purposes.

In operation the non-oxidizing gas flow is enabled to establish gas flow equilibrium conditions with no oxygen in the oxidation chamber 40 after the "prepared" wafer 51 has been placed on the graphite chuck 53. The gas flow heating tube 34 is enabled to the operating temperature and also the heating lamp 56, while the temperature of wafer chuck 53 is monitored. In accordance with one embodiment, the non-oxidizing gas is dry nitrogen, the oxidizing agent is nitrogen plus water vapor and operating conditions are substantially at or above atmospheric pressure. The equilibrium temperature of the graphite chuck 53 having reached the desired point, the gas flow into the oxidation chamber 40 is then switched to the oxidizing agent, preferably water vapor entrained in nitrogen carrier. The oxidation step continues for a duration that is selectable and/or manually terminable through switching back to the non-oxidizing (dry) gas and reducing the temperature of the graphite chuck 53.

Figure 7:
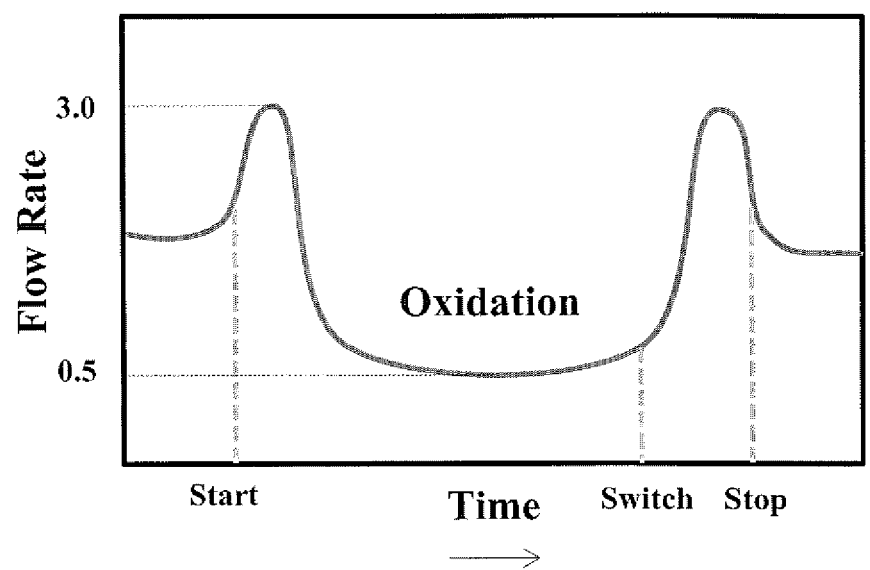
FIG. 7 is a possible time profile for gas flow, intended for process optimization.

It should be noted that gas flow may be subject to programmed variation as exemplified in FIG. 7 for the purpose of oxidation uniformity over the wafer. The oxidizing gas may be injected into the oxidation chamber 40 at a relatively high rate in order to fill the oxidation chamber 40 rapidly and to avoid oxidizing one side of the wafer ahead of the other side. Following this initial oxidation chamber 40 filling, the flow rate of the oxidizing gas may be reduced to minimize any local cooling effect on the wafer and to avoid any nonuniform flow around the structures etched into the wafer. However, the flow rate needs to be sufficient to prevent the formation of any local convection cells. At the termination of the oxidation, the dry gas may be injected at a high flow rate in order to clear the chamber of the oxidizing gas quickly, and to avoid stopping the oxidation on one side of the wafer ahead of the other.

During the oxidation process, infrared light through the microscope objective penetrates the top portion of the semiconductor and allows the microscope to be focused on the layer that is being oxidized. The contrast between the oxidized and non-oxidized segments of this layer enables the monitoring of the oxidation progress.

In another embodiment, a portion of the shortwave infrared radiation used to heat the wafer chuck 53 can pass through holes in the wafer chuck 53 and serve as infrared back illumination for the imaging microscope.

The present invention improves thermal homogeneity and oxidation uniformity through external radiation heating together with thermal isolation of the wafer from the oxidation chamber. Placing the heat source outside the oxidizing environment improves the long term reliability of the system. A condensation barrier in the chamber wall prevents water droplets from landing on the wafer. A selectable dual path valve enables easy swapping of non-oxidizing and oxidizing gas flows in one step and permits controlled duration of the oxidizing process from initiation to termination thereof.

The foregoing description is illustrative of particular embodiments of the application, but is not meant to be a limitation upon the practice thereof. The following claims, including all equivalents thereof, are intended to define the scope of the application.

The invention claimed is:

1. A wafer oxidation apparatus for selective oxidation of a semiconductor workpiece, said wafer oxidation apparatus comprising:
    an oxidation chamber, said oxidation chamber comprising an inlet port and an outlet port;
    at least one window formed in said oxidation chamber;
    a chuck assembly disposed within said oxidation chamber and configured to be approximately thermally isolated from said oxidation chamber;
    carrier gas pathways delivering carrier gasses to said oxidation chamber;
    an infrared viewing and camera assembly coupled to said at least one window.

2. The wafer oxidation apparatus of claim 1, comprising a heat source disposed externally to said oxidation chamber and arranged to direct a radiation flux through said at last one window.

3. The wafer oxidation apparatus of claim 1, comprising an exhaust bubbler coupled to said outlet port of said oxidation chamber.

4. The wafer oxidation apparatus of claim 1, wherein said at least one window forms a gas tight seal with said oxidation chamber.

5. The wafer oxidation apparatus of claim 1, comprising a groove formed around a perimeter of said oxidation chamber configured to house a seal forming a gas tight seal for said at least one window.

6. The wafer oxidation apparatus of claim 1, wherein said at least one window comprises:
    a first window formed on a top surface of said oxidation chamber; and
    a second window formed on a bottom surface of said oxidation chamber.

7. The wafer oxidation apparatus of claim 6, comprising a heat source disposed externally to said oxidation chamber and arranged to direct a radiation flux through said second window.

8. The wafer oxidation apparatus of claim 1, wherein said chuck assembly comprises:
    a graphite platform; and
    a quartz insulator coupled to an interior portion of said chamber to support said graphite platform and approximately thermally isolated from said oxidation chamber.

9. The wafer oxidation apparatus of claim 1, wherein said carrier gas pathways comprises:
    a first gas pathway delivering a first carrier gas;
    a second gas pathway delivering a second carrier gas;
    a gas flow heating device coupled to said first gas pathway and said second gas pathway heating and delivering one of said first carrier gas or said second carrier gas to said oxidation chamber; and
    a value selectively admitting one of said first carrier gas or said second carrier gas to said gas flow heating device.

10. The wafer oxidation apparatus of claim 9, wherein said carrier gas pathways comprises a device coupled to said second gas pathway adding an oxidizing fluid, said second carrier gas comprising said oxidizing fluid.

11. The wafer oxidation apparatus of claim 10, wherein said first carrier gas is a non-oxidizing gas and said second carrier gas comprises said first carrier gas in combination with said oxidizing fluid.

12. The wafer oxidation apparatus of claim 10, wherein said oxidizing fluid is water vapor.

13. A wafer oxidation apparatus for selective oxidation of a semiconductor workpiece, said wafer oxidation apparatus comprising:
    an oxidation chamber, said oxidation chamber comprising an inlet port and an outlet port;
    a first window formed on a top surface of said oxidation chamber;
    a second window formed on a bottom surface of said oxidation chamber;
    a heat source disposed externally to said oxidation chamber and arranged to direct a radiation flux through said second window;
    a chuck assembly disposed within said oxidation chamber and configured to be approximately thermally isolated from said oxidation chamber; and carrier gas pathways delivering carrier gasses to said oxidation chamber.

14. The wafer oxidation apparatus of claim 13, comprising an exhaust bubbler coupled to said outlet port of said oxidation chamber.

15. The wafer oxidation apparatus of claim 13, wherein said carrier gas pathways comprises:
   a first gas pathway delivering a first carrier gas;
   a second gas pathway delivering a second carrier gas;
   a device coupled to said second gas pathway adding an oxidizing fluid, said second carrier gas comprising said oxidizing fluid;
   a gas flow heating device coupled to said first gas pathway and said second gas pathway heating and delivering one of said first carrier gas or said second carrier gas to said oxidation chamber; and
   a value selectively admitting one of said first carrier gas or said second carrier gas to said gas flow heating device.

16. The wafer oxidation apparatus of claim 13, comprising infrared viewing and camera assembly coupled to said at least one window.

17. A wafer oxidation apparatus for selective oxidation of a semiconductor workpiece, said wafer oxidation apparatus comprising:
   an oxidation chamber, said oxidation chamber comprising an inlet port and an outlet port;
   at least one window formed in said oxidation chamber, wherein said at least one window comprises:
      a first window formed on a top surface of said oxidation chamber; and
      a second window formed on a bottom surface of said oxidation chamber;
   a chuck assembly disposed within said oxidation chamber and configured to be approximately thermally isolated from said oxidation chamber; and
   carrier gas pathways delivering carrier gasses to said oxidation chamber.

* * * * *